United States Patent [19]

Sakai et al.

[11] Patent Number: 5,466,942

[45] Date of Patent: Nov. 14, 1995

[54] CHARGED BEAM IRRADIATING APPARATUS HAVING A CLEANING MEANS AND A METHOD OF CLEANING A CHARGED BEAM IRRADIATING APPARATUS

[75] Inventors: Itsuko Sakai; Nobuo Hayasaka, both of Kanagawa; Haruo Okano, Tokyo, all of Japan

[73] Assignee: Kabushiki Kaisha Toshiba, Kanagawa, Japan

[21] Appl. No.: 164,753

[22] Filed: Dec. 10, 1993

Related U.S. Application Data

[62] Division of Ser. No. 907,570, Jul. 2, 1992, Pat. No. 5,312,519.

[30] Foreign Application Priority Data

Jul. 4, 1991 [JP] Japan ..................................... 3-163208

[51] Int. Cl.⁶ ...................................................... H01J 37/00
[52] U.S. Cl. .................................... 250/492.2; 250/492.21
[58] Field of Search ........................... 250/492.2, 492.21, 250/398

[56] References Cited

U.S. PATENT DOCUMENTS

| | | | |
|---|---|---|---|
| 4,659,449 | 4/1987 | Watanabe | 250/492.21 |
| 5,016,663 | 5/1991 | Mase et al. | 134/1 |
| 5,169,407 | 12/1992 | Mase et al. | 134/1 |
| 5,308,989 | 5/1994 | Brubaker | 250/492.21 |

FOREIGN PATENT DOCUMENTS 2162730A 12/1988 Japan .

*Primary Examiner*—Bruce C. Anderson
*Attorney, Agent, or Firm*—Finnegan, Henderson, Farabow, Garrett & Dunner

[57] ABSTRACT

A charged beam irradiating apparatus, comprises a charged beam generating means, a vacuum chamber having a part exposed by the charged beam, the part exposed having contaminations deposited thereon, a gas introducing system connected to the chamber which includes a means for producing electrically neutral active species for removing the contaminations and selectively carrying the species into the chamber, and a system for exhausting the chamber.

16 Claims, 3 Drawing Sheets

12,466,942

CHARGED BEAM IRRADIATING APPARATUS HAVING A CLEANING MEANS AND A METHOD OF CLEANING A CHARGED BEAM IRRADIATING APPARATUS

This is a division of application Ser. No. 07/907,570, filed Jul. 2, 1992 U.S. Pat. No. 5,312,519.

BACKGROUND OF THE INVENTION

1. Field of the Invention

This invention relates to a charged beam irradiating apparatus which is, for example, used for manufacturing semiconductor devices and also relates to a cleaning method of the apparatus.

2. Description of the Related Art

Recently a charged beam irradiating apparatus, for example electron beam exposure apparatus, is used for forming desired patterns of semiconductor devices on a semiconductor substrate or is used for making a mask substrate. As one of the important parts, the apparatus has electrostatic deflectors for scanning and focusing the electron beam. The advantage of the electrostatic deflectors is that they don't have hysteresis, compared with magnetic deflectors, and they have a characteristic of quick response to input signals.

However, a kind of contamination tends to deposit on the surface of the deflectors. Because the deflectors are positioned close to the path of the electron beam, the contaminations cause the deflectors to charged up and they thus deteriorate the performance of the deflectors.

The contaminations are mainly an organic material made from residual gasses in the vacuum chamber of the apparatus. The residual gasses are dissociated by the irradiation of the electron beam and are polymerized on the surface of the deflectors. As a result, the contaminations are formed on the surface of the deflectors.

To prevent the formation of the contaminations, some counter measures are made. For example, there is provided a method for improving the vacuum pressure of the chamber or a method for decreasing scattered electrons of the beam by using a shaped aperture, which limits the electron beam, with a thin knife edge.

However, the formation of contaminations cannot be prevented completely regardless of these counter measures. Therefore, the deflectors must be removed from the apparatus to be cleaned or exchanged frequently. Without the cleaning or the exchanging, the contaminations become a cause of decreasing performance and they lead to the deterioration of exposure accuracy or through put.

The contaminations cannot be easily removed by organic solvents, and are usually cleaned off by decomposing abrasives. This cleaning method makes the operating rate of the apparatus extremely low, and increases the personnel expenses necessary for the disassembly, cleaning and reassembly of the apparatus.

Also, the cleaning method using the abrasives cannot be used if part of the apparatus has a possibility of receiving damage to its surface material.

The contaminations are also observed on the surface of other parts exposed by the electron beam, such as apertures, electrical lenses, electrodes of the electric gun, a substrate or the inner surface of an optical column. These parts also need to be cleaned or exchanged.

So a simpler and more effective method for removing the contaminations is desired.

To prevent the problem, a method for removing the contaminations is presented. That is, a high frequency voltage is given between the inner surface of the optical column and an electrode which is inserted along the inner portion of the column.

Reactive gasses, such as $CF_4$, $O_2$ are introduced into the column and a gas plasma is generated in the column. As a result, the contaminations on the inner surface of the column are removed. After this, the exposure process is resumed (Japanese patent application, KOKAI No. 61-20321).

However, this method has another problem in that the material of the apparatus is damaged by the plasma. Especially, the damage to the electrostatic deflectors is a serious problem. The causes of the damage are thought to be ion impacts of the plasma or temperature increase of the parts by the impacts.

The same problem as the electron beam exposure apparatus occurrs in a scanning electron microscopy, an electron beam tester, an ion beam irradiating apparatus, or other apparatuses which use beams of charged particles.

SUMMARY OF THE INVENTION

Accordingly, it is an object of the present invention to be able to remove contaminations formed on the parts of a charged beam irradiating apparatus without causing any damage.

It is another object of the present invention to remove the contamination without removing the parts or disassembling the apparatus.

To attain the objects of the invention, there is provided s charged beam irradiating apparatus which comprises:

a means for generating a charged beam;

a vacuum chamber having s part exposed by the charged beam;

a gas introducing system connected to the chamber, which includes a processing means for producing electrically neutral active species and selectively carrying substantially only the neutral active species into the chamber; and a system for exhausting the chamber.

To accomplish the above described objects, there is provided a charged beam irradiating apparatus which comprises:

a means for generating a charge beam;

a vacuum chamber having a portion exposed by the charged beam, the portion exposed having contaminations deposited thereon;

a gas introducing system having a discharge tube for generating active species and a gas introduction port connecting the discharge tube and the vacuum chamber, which tube has a length sufficient to select electrically neutral and long life species from among the active species; and an exhausting system for exhausting the chamber.

And also provided a method of cleaning a charged beam irradiating apparatus having a part exposed by a charged beam contained in a vacuum chamber, the part exposed having organic contaminations, comprises:

exhausting the vacuum chamber;

selectively introducing electrically neutral active species into the chamber; and removing the contaminations from the exposed part by the introduced electrically neutral active species.

DESCRIPTION OF THE PREFERRED EMBODIMENTS

Figure 1:
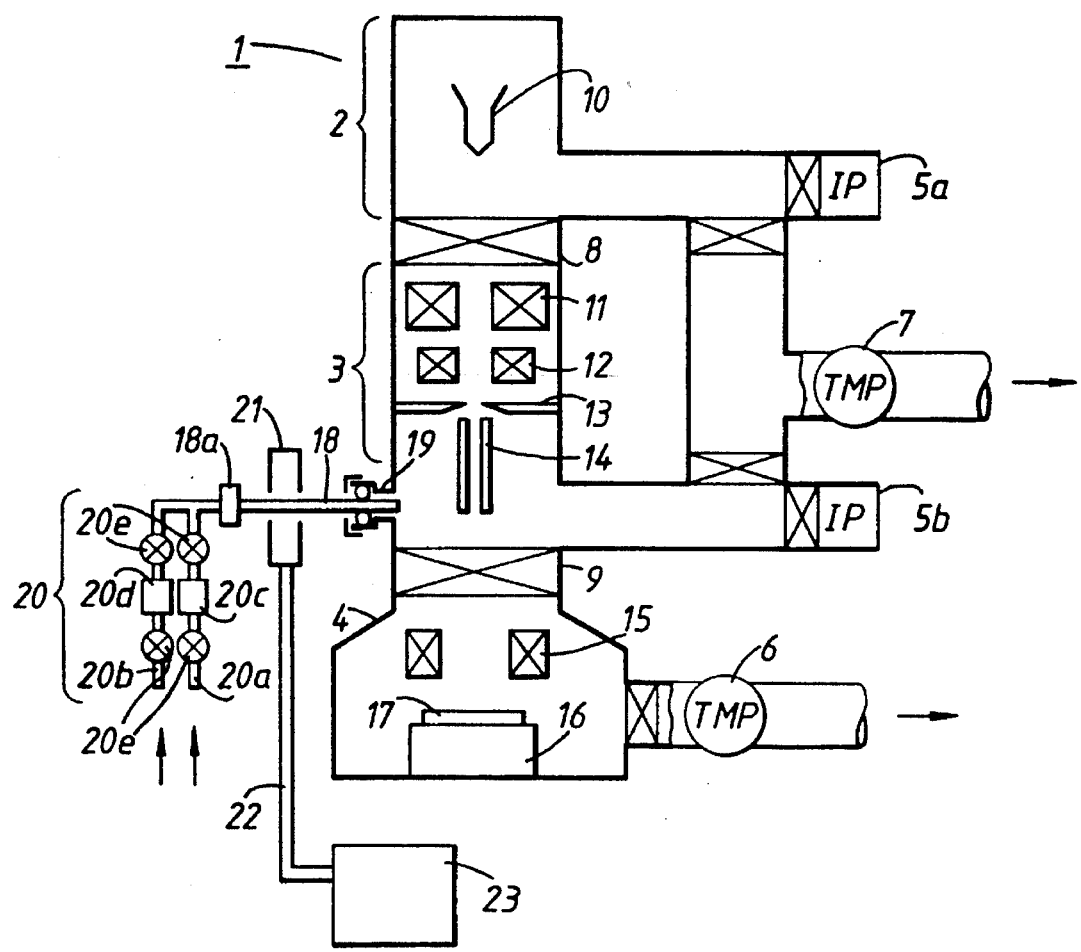
FIG. 1 is a schematic sectional view of the first embodiment of the present invention.

FIG. 1 shows a schematic sectional view of the first embodiment of the present invention, which presents an electron beam exposure apparatus.

A vacuum chamber 1 of the apparatus comprises an electron gun chamber (an electron beam generating means) 2, a second chamber 3 for controlling the direction or the configuration of the electron beam and a third chamber 4 for holding and processing a substrate. These chamber 2, 3 and 4 are exhausted differentially by a first ion pump 5a, a second ion pump 5b and a turbo molecular pump 6 respectively.

Electron gun chamber 2 and second chamber 3 are roughly exhausted by a second turbo molecular pump 7 first, and after that the chambers are exhausted by first and second ion pumps 5a, 5b.

The apparatus has two gate valves 8, 9 being between second chamber 3 and electron gun chamber 2 or third chamber 4, in order to vacuously separate each chamber.

The electron gun chamber has an electron gun 10 for irradiating an electron beam. The electron beam is focused by first and second focusing lenses 11,12, and controlled in desired patterns and desired positions by an aperture 13 and electrostatic deflectors 14. The controlled electron beam is irradiating a substrate 17 of the third chamber.

The third chamber has an objective lens 15 at the upper portion, which receives the controlled electron beam and focuses the beam on the substrate 17 placed on a sample holder 16.

The second chamber is connected to a gas introducing system 20. That is, one end portion of a quartz discharge tube 18 functions as an active species introduction port 19. Another end portion of the tube 18 is coupled to first and second tubes 20a, 20b, each having two gas valves 20e and a mass flow controller 20c, 20d between the two valves. $O_2$ gas and $CF_4$ gas are supplied to the first and the second tubes respectively.

The middle portion of the quartz discharge tube is surrounded by a micro wave cavity 21 which is connected to a microwave power supply 23.

The gasses, from the first and second tube, are dissociated in the quartz discharge tube 18 and many kinds of active species are generated by the microwave power, supplied from the power supply 23 to the micro wave cavity 21. The active species in the discharge tube include F* (radical), $CF2^+$, $CF3^+$, O* (radical) electrons, and so on Among these active species, F* and O* are selectively introduced to the second chamber 3 through the active species introduction port 19.

More detailed description of the cleaning method by using the apparatus will be explained, with reference to FIG. 1.

The apparatus has been used for 6 months in order to expose many substrates, on which resist film is formed. Contaminations made of polymers comprised of carbon, oxygen and hydrogen, are formed on the surfaces of components such as an aperture 13, focusing lenses 11, 12, deflectors 14 or any other portions exposed by the electron beam.

The deflectors are made of duralumin coated by a gold plated layer. The contaminations are formed by a reaction between the electron beam and hydrocarbon of the system's residual gas, back streamed to the chamber from the oil of the pumps.

If disassembling of the apparatus or removal of parts for the cleaning are needed, the apparatus cannot be used for about one week. However, according to the embodiment, the problem is reduced as follows. That is, firstly, the second chamber for controlling the electron beam is separated from the electron gun chamber 2 and the third chamber 4 by the gate valves 8 and 9, respectively, and is exhausted by the turbo molecular pump 7.

Secondly, 700 sccm (standard cubic centimeters per minute) of oxygen gas and 35 sccm of $CF_4$ gas from gas introducing tubes 20a, 20b are introduced into the quartz discharge tube 18. The pressure of the second chamber 3 is kept at 0.2 Torr.

Thirdly, 100 W of the microwave power (2.45 GHz) is supplied to the discharge tube 18 through the microwave cavity 21, whereby the gasses are discharged. The discharged gasses include electrically neutral active species such as O* (O radical), F* (F radical), $CF*_3$ radical as well as electrons and positive ions, such as $CF_2^+$, $CF_3^+$.

Among the species, the electrically neutral active species having long life, such as O* and F*, are selectively carried to the second chamber 3 through the introduction port 19.

At this time, the other species, such as the electrons or the positive ions do not go into the second chamber 3 because these species are too short lived to be carried into the chamber 3. The neutral species can not flow into the electron gun chamber 2 and the third chamber 4 because of the separation by the gate valves 8 and 9.

According to these steps, the contaminations of the components in the second chamber are quickly and completely removed by the O* and F*.

The radicals are electrically neutral, so they can flow even into complex parts or an inner surface of a narrow cylindrical structure and can remove the contaminations formed on the inner surface.

Removing contaminations in these parts cannot be achieved by the method using plasma, because the plasma cannot go into the complex portions.

The removal mechanism is considered to be that the contaminations are weakened by the action of F* and the weakened contaminations are oxidized by the O*. As a result, the dissolution of the contaminations is promoted.

Figure 2:
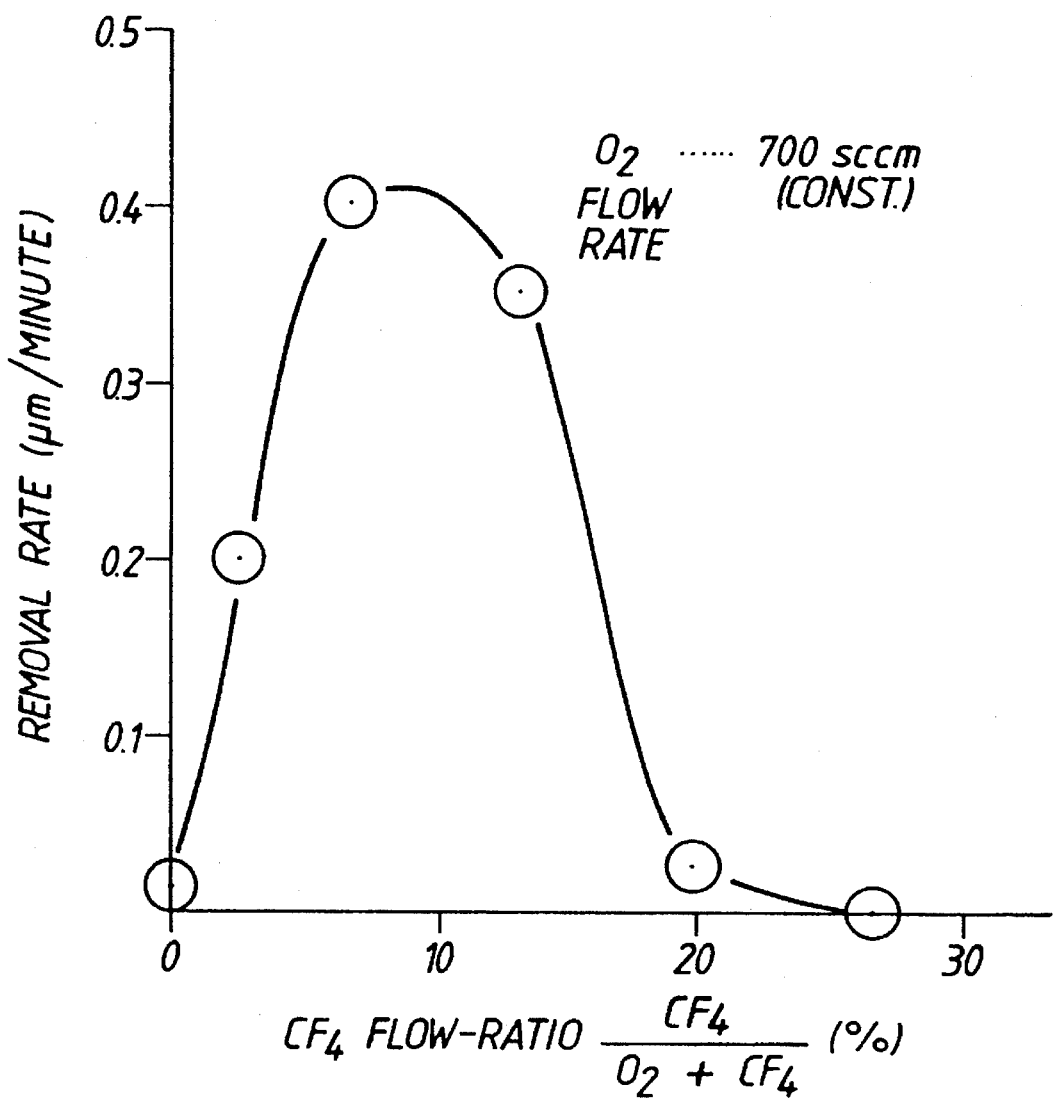
FIG. 2 shows a graphical representation to explain the advantage in the embodiment of the present invention.

In the embodiment, 35 sccm of $CF_4$ and 700 sccm of $O_2$ are introduced, but the other flow rates can be also used. FIG. 2 shows a characteristic graph presenting the removal rate against the flow ratio. The removal rate is the removed thickness of the contamination per minute.

As shown in FIG. 2, 2%–20% of $CF_4$ of the total flow rate ($O_2+CF_4$) gives a removal rate of more than 0.05 μm/minute. This value of the removal rate is fully effective in practice. Moreover, in the case of 5%–15% of $CF_4$ flow rate, more than 0.3 μm/minute of the removal rate could be attained, so it is even more practical. And the maximum removal rate 0.4 μm/minute can be attained at 10% of $CF_4$ flow rate.

The lower limit (2%) and the upper limit (20%) of the flow ratio are determined because at least some quantity of F* is needed for the fragilization, but if excessive F* are supplied to the contamination, they disturb the action of the O* and decrease the effect of the removal.

As comparative examples, $0_2$ gas and $CF_4$ gas without activation were introduced into the second chamber 3. However, in this situation, the contamination could not be removed at all.

And as another comparative example, $O_2$ gas and $CF_4$ gas were discharged in the second chamber 3. According to the example, the discharge is generated near the deflectors 14 and the contamination on the deflectors could be removed. However a part of the gold plating layer of the deflectors 14 were pealed off and the underlying material of duralumin was exposed. This is the result of ion damage by the discharge and temperature increased of the deflectors according to the discharge.

In this comparative example, the other narrow complex portions could not be fully removed and some abnormal discharge was generated because the structure of the chamber was complicated.

As explained above, according to the first embodiment many advantages can be obtained. That is, it is possible to remove the contaminations effectively which cannot be removed by the usual organic solvents. It is also possible to remove the contamination which are formed on materials where decomposing abrasives or other processes with a strong physical action cannot be used. And the removal process can be easily done without removing the deflectors or the other parts and without opening the vacuum chamber at all.

So the electron beam irradiating apparatus can achieve a high operating rate and a high efficiency.

It is also possible not to provide any damages to the above parts of the apparatus during the cleaning, so the maintenance of the apparatus is very simplified.

Figure 3:
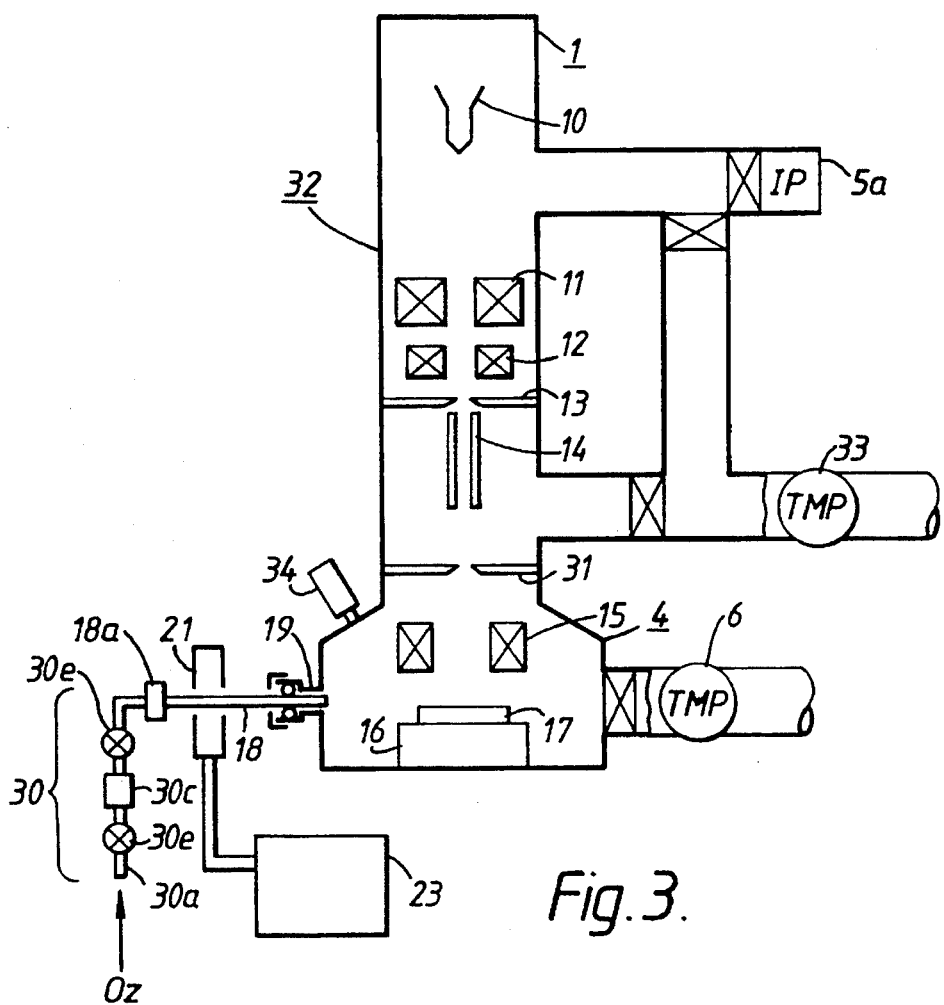
FIG. 3 shows a schematic sectional view of the second embodiment of the present invention.

FIG. 3 shows a schematic sectional view of a second embodiment of the present invention. The same parts as that of the FIG. 1 are given the same reference numbers and the detailed descriptions are abbreviated here.

In this embodiment, a vacuum chamber 1 is divided into an optical column 32 (a charged beam controlling means) and a sample chamber 4 by a second aperture The optical column 32 and the sample chamber 4 are exhausted differentially by the turbo molecular pump 6, 33. The electron gun chamber is included in the optical column 32. The sample chamber 4 has a secondary electron detector 34. A gas introducing system 30 has a tube having two gas valves 30e and a mass flow controller 30c between the two valves. $O_2$ gas is supplied to the discharge tube 18 through the tube.

In this second embodiment, the different point from the first embodiment is that the removal of the contaminations is carried out by using only $O_2$ gas and is also carried out during the operation of the exposing apparatus.

That is, 5 sccm of $O_2$ gas is introduced to the quartz discharge tube 18 from the introducing system 30 and the pressure in the sample chamber 4 is kept at $1 \times 10^{-3}$ Torr.

A 100 W of microwave power (2.45 GHz) provided by the source supply 23, is given to the discharge tube 18 through the microwave cavity 21, whereby $O_2$ gas is discharged.

The discharged $O_2$ gas includes several kinds of species, but only electrically neutral radicals such as O* are transported into the sample chamber 4. The O radicals as well as other species, such as electron and positive ions cannot flow into the optical column 32 because of differential pumping, similar to the first embodiment. The pressure of the optical column 32 is kept at $1 \times 10^{-6}$ Torr.

In this state, an electron beam is irradiated for the exposure of the substrate 17 with a resist film on its surface. The irradiation of the substrate 17 is made for 30 minutes.

As a result, on the irradiated area of the surface (2 μm×3 μm) on the substrate 17, no contaminations is observed. This is because the residual gasses, dissociated by the electron beam, react with the 0 radicals one after another and the reacted gasses are exhausted as CO, $CO_2$ and $H_2$ without depositing on the substrate as contaminations. And also no damage of the objective lens 15 and substrate 17 are observed.

As a modification of the embodiment, $O_3$ can be also used instead of O radicals. It is also possible for the O radicals to be introduced into the optical column 32.

According to the modification, the deposition of the contamination on the parts exposed by the electron beam, such as the deflectors 14, is prevented without any damage.

The embodiment and the modification mean that the removal of the contaminations can be achieved during the operation of the apparatus. That is, according to these, there is no need to prepare extra time for removal of the contaminations.

TABLE 1 shows the advantage of the second embodiment.

Each case respectively show (1) no gas, (2) $O_2$ gas without discharge, (3) O radicals produced by the discharge and (4) $O_3$ produced by a silent discharge, are introduced into the chamber 4. The cases (1), (2) are comparative examples, the cases (3), (4) are embodiments according to the invention.

The conditions of the contamination deposition are checked in the above four cases, respectively, after finishing the irradiation of a 0.2 μm diameter spot electron beam for five minutes to the substrate.

In the initial state, no contaminations were observed on the surface of the substrate in each case. A contamination of ϕ0.2 μm and height 5 μm was formed on the substrate in the case (1) after the irradiation. The volume of the deposition of the other cases are shown in the table with the case (1) being 100%.

TABLE 1

| introducing gas | flow rate | vacuum pressure | state of deposition of contamination |
|---|---|---|---|
| (1) NONE | 0 sccm | $4 \times 10^{-6}$ Torr | ϕ 0.2 μm × 5 μm (H) 100% |
| (2) $O_2$ | 5 sccm | $1 \times 10^{-3}$ Torr | 85% |
| $O_2/CF_4$ | 4/1 sccm | $1 \times 10^{-3}$ Torr | 100% |
| $O_2/SF_6$ | 4/1 sccm | $1 \times 10^{-3}$ Torr | 100% |
| (3) O* | 5 sccm | $1 \times 10^{-3}$ Torr | 2% |
| | 2 sccm | $4 \times 10^{-4}$ Torr | 2% |
| | 0.5 sccm | $1 \times 10^{-4}$ Torr | 30% |
| (4) $O_3$ (5%) | 5 sccm | $1 \times 10^{-3}$ Torr | 10% |
| | 2 sccm | $4 \times 10^{-4}$ Torr | 20% |
| | 0.5 sccm | $1 \times 10^{-4}$ Torr | 40% |

As shown in TABLE 1, the deposition was spicuous in the case (1) and (2). However, it was effectively suppressed in the cases that introduce O radicals (3) or $O_3$ (4). In cases (3), (4), no damage occured on the surface of parts, such as the electrostatic deflectors 14 or the objective lens 15 in the vacuum chamber 4 or 32.

Needless to say, $CF_4$ gas can be added in the second embodiment the same as the first embodiment so as to promote the reaction.

The important thing in the second embodiment is that there is no bad influence to the electron beam even if the removal is made during the operation of the exposed apparatus. This is because the introduced active species are electrically neutral.

Figure 4:
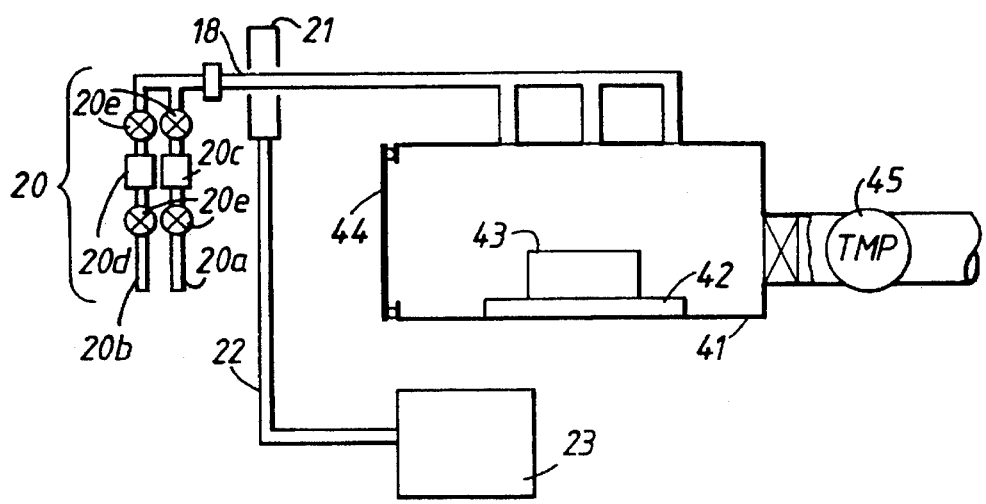
FIG. 4 is a schematic sectional view to explain the third embodiment of the present invention.

FIG. 4 shows a schematic sectional view of a cleaning apparatus to explain a third embodiment of the present invention. The same parts as that of FIG. 1 are given the same reference numbers and detailed descriptions are abbreviated here.

In this embodiment, a vacuum chamber 41 has a sample holder 42 on its bottom portion. A component 43 of the electron beam exposure apparatus is placed on the sample holder 42. The component 43 is comprised of a set of some parts without disassembly, taken out of the apparatus. The contaminations are formed on the inner and outer surfaces of the component 43. And also the apparatus has a heating means (not shown in the figure) to heat the component 43. The heating means is provided in the holder 42 or the wall of the chamber 1.

The component 43 goes into the chamber 41 through a vacuum door 44. After vacuum exhaustion, O radicals and F radicals are introduced into the vacuum chamber 41 from the gas introducing system 20 through the quartz discharge tube 18 and the component is cleaned the same as the first embodiment.

According to the cleaning method of the embodiment, the similar advantage as the first embodiment, with regard to the removal, can be obtained. Moreover another advantage can be obtained. That is, there is no need to provide the gas introducing system for each electron beam exposure apparatus and many components from numerous apparatuses can be cleaned by a single cleaning apparatus shown in FIG. 4.

Also, by heating the components after or during the removal of the contaminations, any remaining reactants such as oxygen or fluorine, or products, such as oxides and fluorides on the surface of the components can be easily vaporized and removed.

The present invention is not limited to the described embodiment and it can be easily applied for any charged beam irradiating apparatus, such as a scanning electron microscopy, an electron beam tester or an ion beam irradiating apparatus.

The gasses for removing the contaminations can be selected properly. For example, in the first and second embodiment, by using a gas mixture of $NF_3$ and $H_2O$, or a compound gas such as $COF_2$, OF, similar results can be obtained. And in the case of a tough contamination whose removal rate is slow, it is possible to expose the components to $H_2$ plasma for a moment beforehand. According to this, the removal rate can be improved. This is because C—H bonds are formed in the contaminations by the $H_2$ plasma and the hydrogens are then easily extracted by the F radicals, whereby the contaminations are dissolved.

The introduction of the neutral active species can be done from either the optical column or the sample chamber. It is desired that the active species introduction port 19 be positioned near the portion having the most serious problem of the contaminations.

And if necessary, multi-port separated from the discharge tube 18 can be also used so as to supply the species to larger areas. It is also possible to provide a heating means for vaporizing residual reactants or its products the same as in the third embodiment.

In the second embodiment, $O_3$ can be directly introduced from an $O_3$ generator instead of $O_2$. And a compound gas made of oxygen and nitrogen or halogen such fluorine and chlorine are also effective in the removal of the contamination.

Numerous modifications and variations of the present invention are possible in light of the above teachings. It is therefore to be understood that, within the scope of the appended claims, the present invention can be practiced in a manner other than as specifically described herein.

What is claimed is:

1. A charged beam irradiating apparatus for processing semiconductor substrates under conditions causing development of contaminants, the apparatus comprising:

means for generating a charged beam;

a vacuum chamber enclosing at least one part of the apparatus exposed by the charged beam and thus subject to deposit of the contaminants thereon;

a gas introducing system connected to the chamber, the gas introducing system including means for producing electrically neutral active species and other species including at least one of electrons and positive ions, and for introducing a selected carried species, including substantially only the neutral active species, into the chamber to remove the contaminants from the at least one part; and a system for exhausting the removed contaminants from the chamber.

2. A charged beam irradiating apparatus according to claim 1, further comprising a sample chamber for holding a substrate for processing.

3. A charged beam irradiating apparatus according to claim 2, wherein the gas introducing system is capable of being operated during processing of the substrate.

4. A charged beam irradiating apparatus according to claim 1, wherein the carried species consists essentially of either oxygen radicals or $O_3$.

5. A charged beam irradiating apparatus according to claim 1, wherein the carried species consists essentially of halogen radicals and either oxygen radicals or $O_3$.

6. A charged beam irradiating apparatus according to claim 5, wherein the halogen radicals are fluorine radicals.

7. A charged beam irradiating apparatus according to claim 1, wherein the chamber comprises an electron gun chamber, an optical column chamber for controlling the electron beam, and a sample chamber, with at least one of those chambers being connected to the gas introducing system.

8. A charged beam irradiating apparatus according to claim 1, wherein the gas introducing system is operated during an interruption of the irradiation.

9. A charged beam irradiating apparatus according to claim 1, further comprising a heating means for heating the at least one part.

10. The apparatus recited in claim 1 wherein the contaminants are polymerized contaminents.

11. The apparatus recited in claim 1 wherein the means for generating a charged beam is located in a chamber separated from the vacuum chamber.

12. A charged beam irradiating apparatus for processing semiconductor substrates under conditions causing development of contaminants, the apparatus comprising:

means for generating a charged beam;

a vacuum chamber enclosing at least one part of the apparatus exposed by the charged beam and thus subject to deposit a gas introducing system connected to the chamber, the gas introducing system having a discharge tube for generating active species and a gas introduction port for connecting the discharge tube and the vacuum chamber, the discharge tube having a length sufficient to select electrically neutral and long life species from the active species for introduction into the chamber to remove the contaminants from the at least one part; and a system for exhausting the removed contaminants from the chamber.

13. A charged beam irradiating apparatus according to claim 12, wherein the gas introducing system has an oxygen containing gas introducing tube and fluorine containing gas introducing tube.

14. A charged beam irradiating apparatus according to claim 13, wherein the selected neutral long life species are oxygen radicals and fluorine radicals.

15. A charged beam irradiating apparatus according to claim 13, further comprising a heating means for heating the exposed part.

16. An electron beam exposing apparatus for processing semiconductor substrates under conditions causing development of contaminants, the apparatus comprising:

means for generating an electron beam;

a vacuum chamber enclosing parts of the apparatus exposed by the charged beam and thus subject to deposit of the contaminants thereon, said parts including electrodes of the beam generating means, apertures for limiting the electron beam, electrostatic deflectors for deflecting the electron beam, electron lenses for focusing the beam, and an exposed substrate;

a gas introducing system connected to the chamber, the gas introducing system including means for producing electrically neutral active species and other species including at least one of electrons and positive ions, and for selectively carrying substantially only the neutral active species into the chamber to remove the contaminants from said parts of the apparatus; and a system for exhausting the removed contaminants from the chamber.

* * * * *